United States Patent
Shirasaki

(10) Patent No.: US 6,628,148 B2
(45) Date of Patent: Sep. 30, 2003

(54) SAMPLE AND HOLD CIRCUIT HAVING A SINGLE CONTROL SIGNAL

(75) Inventor: Hijiri Shirasaki, Miyazaki (JP)

(73) Assignee: Oki Electric Industry CO, Ltd., Tokyo (JP)

( * ) Notice: Subject to any disclaimer, the term of this patent is extended or adjusted under 35 U.S.C. 154(b) by 0 days.

(21) Appl. No.: 09/975,321

(22) Filed: Oct. 12, 2001

(65) Prior Publication Data

US 2002/0186054 A1 Dec. 12, 2002

(30) Foreign Application Priority Data

Jun. 11, 2001 (JP) ........................................ 2001/175950

(51) Int. Cl.[7] .............................................. G11C 27/02
(52) U.S. Cl. ........................... 327/95; 327/96; 327/563; 341/122
(58) Field of Search ..................... 327/91, 93, 94–96, 327/336, 337, 341, 362, 363, 561–563; 341/122–125; 330/252, 253, 257

(56) References Cited

U.S. PATENT DOCUMENTS 5,296,751 A * 3/1994 Sano ............................. 327/73
5,304,866 A * 4/1994 Uranaka ....................... 327/63
5,959,470 A * 9/1999 Sugihashi ..................... 327/91

FOREIGN PATENT DOCUMENTS

| JP | 6-54418 | 7/1994 |
| JP | 11-249633 | 9/1999 |
| JP | 11-345497 | 12/1999 |

* cited by examiner

Primary Examiner—Minh Nguyen
(74) Attorney, Agent, or Firm—Rabin & Berdo, P.C.

(57) ABSTRACT

When a switching signal SW is at "H", TGs (3a and 5b) are turned on and an input voltage IN is supplied to a capacitor (4a) and a differential input unit (10a) through TG (3a). At this time, a differential input unit (10b) is connected to an output unit (20) through TG (5b) and a voltage follower circuit is constructed. A voltage held in a capacitor (4b) is outputted as an output voltage OUT from an output terminal (7). When the switching signal SW is set to "L", TGs (3b and 5a) are turned on, and a voltage follower circuit is constructed by the differential input unit 10a and output unit (20). A voltage held on the input side of the capacitor (4a) and differential input unit (10a) is outputted as an output voltage OUT from the output terminal (7).

6 Claims, 3 Drawing Sheets

PRIOR ART

SAMPLE AND HOLD CIRCUIT HAVING A SINGLE CONTROL SIGNAL

BACKGROUND OF THE INVENTION

1. Field of the Invention

The invention relates to a sample and hold circuit for holding an input voltage in response to a timing signal and outputting the holding voltage and, more particularly, to a sample and hold circuit which is suitable for use in a driving apparatus of an image display apparatus like a liquid crystal panel.

2. Related Background Art

A sample and hold circuit is used, for example, for a thin-film transistor driving circuit or the like of a liquid crystal panel. FIGS. 2(a) and 2(b) are circuit diagrams showing examples of constructions of conventional sample and hold circuits.

The sample and hold circuit shown in FIG. 2(a) is a circuit of the parallel 2-latch/1-buffer amplifier type disclosed in JP-B-6-54418 and has an input terminal 1 to which an input voltage IN is supplied and a control terminal 2 to which a switching signal SW is supplied. Capacitors 4a and 4b for holding the input voltage IN are connected to the input terminal 1 through transfer gates (hereinafter, also referred to as "TGs") 3a and 3b, respectively. The capacitors 4a and 4b are connected to the input side of a buffer amplifier (hereinafter, also referred to as "AMP") 6 having a voltage amplification factor 1 through TGs 5a and 5b, respectively. The output side of the AMP 6 is connected to an output terminal 7. The switching signal SW of the control terminal 2 is supplied as a control signal to the TGs 3a and 5b, inverted by an inverter 8, and supplied as a control signal to the TGs 3b and 5a. Each of the TGs 3b, 5a, and 5b has the same construction as that of the TG 3a.

According to such a sample and hold circuit, when the switching signal SW is at the "H" level, the TGs 3a and 5b are turned on and the TGs 3b and 5a are turned off, so that the input voltage IN at the input terminal 1 is charged into the capacitor 4a through the TG 3a. On the other hand, a voltage charged in the capacitor 4b is supplied to the AMP 6 through the TG 5band outputted as an output voltage OUT from the AMP 6 to the output terminal 7.

Subsequently, when the switching signal SW is set to the "L" level, the TGs 3a and 5b are turned off and the TGs 3b and 5a are turned on, so that the input voltage IN at the input terminal 1 is charged into the capacitor 4b through the TG 3b. On the other hand, a voltage charged in the capacitor 4a is supplied to the AMP 6 through the TG 5a and outputted as an output voltage OUT from the AMP 6 to the output terminal 7.

As mentioned above, the input voltage IN is alternately charged into the two capacitors 4a and 4b in response to the switching signal SW and the charged voltage is outputted as an output voltage OUT through the AMP 6.

On the other hand, the sample and hold circuit shown in FIG. 2(b) is a circuit of the parallel 2-latch/2-buffer amplifier type disclosed in JP-A-11-249633 and constructed in a manner similar to that of FIG. 2(a) except that the AMP 6 at the post stage of the TGs 5a and 5b in FIG. 2(a) is deleted and AMPs 6a and 6b are provided between the capacitors 4a and 4b and the TGs 5a and 5b, respectively.

According to such a sample and hold circuit, when the switching signal SW is at the "H" level, the input voltage IN at the input terminal 1 is charged into the capacitor 4a through the TG 3a. On the other hand, the voltage charged in the capacitor 4b is supplied to the TG 5b through the AMP 6b and outputted as an output voltage OUT to the output terminal 7 through the TG 5b.

Subsequently, when the switching signal SW is set to the "L" level, the input voltage IN at the input terminal 1 is charged into the capacitor 4b through the TG 3b. On the other hand, the voltage charged in the capacitor 4a is supplied to the TG 5a through the AMP 6a and outputted as an output voltage OUT to the output terminal 7 through the TG 5a.

However, the conventional sample and hold circuits shown in FIGS. 2(a) and 2(b) have the following problems.

In the circuit of FIG. 2(a), since the amplifier for both capacitors 4a and 4b is used in common as an AMP 6, for example, when the switching signal SW is switched from "H" to "L", the TG 5a is turned on and the capacitor 4a is connected to the input side of the AMP 6. At this time, a parasitic capacitance on the input side of the AMP 6, that is, an electrostatic capacitance of a gate of an MOS transistor constructing a non-inverting input terminal of the AMP 6 has been charged to the same voltage as the output voltage OUT just before the switching. The electrostatic capacitance of the gate of the MOS transistor at each non-inverting input terminal which gives the parasitic capacitance is equal to about $\frac{1}{10}$ of that of each of the capacitors 4a and 4b. The input voltage of the AMP 6 is influenced by the charges charged in the parasitic capacitor, the initial voltage held in the capacitor 4a changes, and an error is caused in the input voltage of the AMP 6.

On the other hand, according to the circuit of FIG. 2(b), since the voltages which are applied to the capacitors 4a and 4b through the TGs 3a and 3b are simultaneously inputted to the dedicated AMPs 6a and 6b, the error which is caused in the parasitic capacitor due to the common use of the amplifier as in case of the circuit of FIG. 2(a) does not occur. However, since the two AMPs 6a and 6b are necessary, there is a problem of an increase in current consumption.

OBJECTS AND SUMMARY OF THE INVENTION

It is an object of the invention to provide a sample and hold circuit which does not cause an error due to a parasitic capacitance on the input side of an AMP and an increase in current consumption.

The invention is fundamentally made by paying attention to a construction in which an amplifier comprises: a differential input unit which generates a voltage according to a voltage difference between an input signal which is applied to a non-inverting input terminal and an input signal which is applied to an inverting input terminal; and a amplification output unit which amplifies an output voltage of the differential input unit. The invention is also based on an idea such that for the purpose of forming a pair of capacitors for holding an input voltage, a pair of differential input units are provided and a single amplification output unit which is shared by both of the differential input units is provided, thereby allowing the amplification output unit to alternately construct an amplifier together with both of the differential input units.

According to the first aspect of the invention, there is provided a sample and hold circuit comprising:

a pair of first switches whose operations are controlled by a switching signal and which alternately transfer input voltages to first and second nodes;

first and second capacitors which hold the input voltages transferred to the first and second nodes, respectively;

a first differential input unit which generates a voltage corresponding to a potential difference between the first node and an output terminal;

a second differential input unit which generates a voltage corresponding to a potential difference between the second node and the output terminal;

a pair of second switches which are controlled by the switching signal, transfer the voltage generated by the second differential input unit to a third node when the input voltage has been transferred to the first node, and transfer the voltage generated by the first differential input unit to the third node when the input voltage has been transferred to the second node; and an output unit which outputs a voltage corresponding to the voltage at the third node to the output terminal.

The first and second differential input units have non-inverting input terminals and inverting input terminals. The non-inverting input terminals may be constructed by gates of field effect transistors. The non-inverting input terminals are connected to the first and second nodes, and an output of the output unit is fed back to the inverting input terminals, respectively.

For example, the output unit constructs a buffer amplifier together with each of the differential input units.

Each capacitor is, for example, a sample holding capacitor for holding a sampled image signal.

The first and second differential input units have, for example, field effect transistors each of which is serially connected to a single constant current circuit through the corresponding second switch, whose gates are connected to the corresponding first and second nodes, and which are mutually connected in parallel through the first and second switches.

Each of the first and second differential input units has an inverting input terminal to which an output of the output unit is fed back.

According to the second aspect of the invention, there is provided a sample and hold circuit comprising: a pair of switches which are controlled by a switching signal and transfer input voltages to first and second nodes; first and second capacitors which hold the input voltages transferred to the first and second nodes, respectively; and a buffer amplifier which is controlled by the switching signal, outputs the voltage held in the second capacitor to an output terminal when the input voltage has been transferred to the first node, and outputs the voltage held in the first capacitor to the output terminal when the input voltage has been transferred to the second node, wherein the buffer amplifier comprises a first non-inverting input unit having a first transistor which is on/off controlled by the switching signal and a second transistor which is serially connected to the first transistor and receives the voltage of the first capacitor and whose conducting state is controlled by this voltage, a second non-inverting input unit which is connected to the first non-inverting input unit in parallel and has a third transistor which is on/off controlled by the switching signal in a complementary manner with the first transistor and a fourth transistor which is serially connected to the third transistor and receives the voltage of the second capacitor and whose conducting state is controlled by this voltage, an inverting input unit which is connected to the first and second non-inverting input units in parallel and has a fifth transistor whose conducting state is controlled by the voltage at the output terminal, a differential voltage generating unit which generates a voltage according to a difference between a current flowing in the first or second non-inverting input unit and a current flowing in the inverting input unit, and an output unit having a sixth transistor whose conducting state is controlled by the voltage generated from the differential voltage generating unit and which outputs a voltage corresponding to the voltage of the first or second capacitor connected to the first or second non-inverting input unit controlled to an ON state by the switching signal to the output terminal.

In the buffer amplifier, for example, a transistor which is always set to the ON state is serially connected to the fifth transistor of the inverting input unit.

According to the third aspect of the invention, there is provided a sample and hold circuit for sequentially holding sampling voltages which are applied to an input terminal, comprising:

a pair of switches which are mutually connected to the input terminal in parallel and complementarily perform the switching operations;

a pair of capacitors which are selectively connected to the input terminal by each switch and sequentially and alternately hold the sampling voltages by the switching operation of each switch;

a pair of differential input units which are provided in correspondence to each of the capacitors and each of which has a non-inverting input terminal to which the sampling voltage held in the corresponding capacitor is applied, an inverting input terminal, and an output terminal which outputs an output voltage corresponding to a voltage difference between the inverting input terminal and the non-inverting input terminal; and a single amplification output unit which has an input terminal which selectively and alternately receives the output voltages at the output terminals of both of the differential input units and an output terminal which amplifies the voltage that is applied to the input terminal and outputs the amplified voltage, and in which the output terminal voltages are fed back as feedback voltages to both of the inverting input terminals of the pair of differential input units, thereby alternately constructing a buffer amplifier in cooperation with each of the pair of differential input units.

Each of the non-inverting input terminals of the pair of differential input units is constructed by, for example, a gate of a field effect transistor.

The sampling voltage is an image signal for a display apparatus.

The above and other objects and features of the present invention will become apparent from the following detailed description and the appended claims with reference to the accompanying drawings.

DETAILED DESCRIPTION OF THE PREFERRED EMBODIMENTS (First Embodiment)

Figure 1:
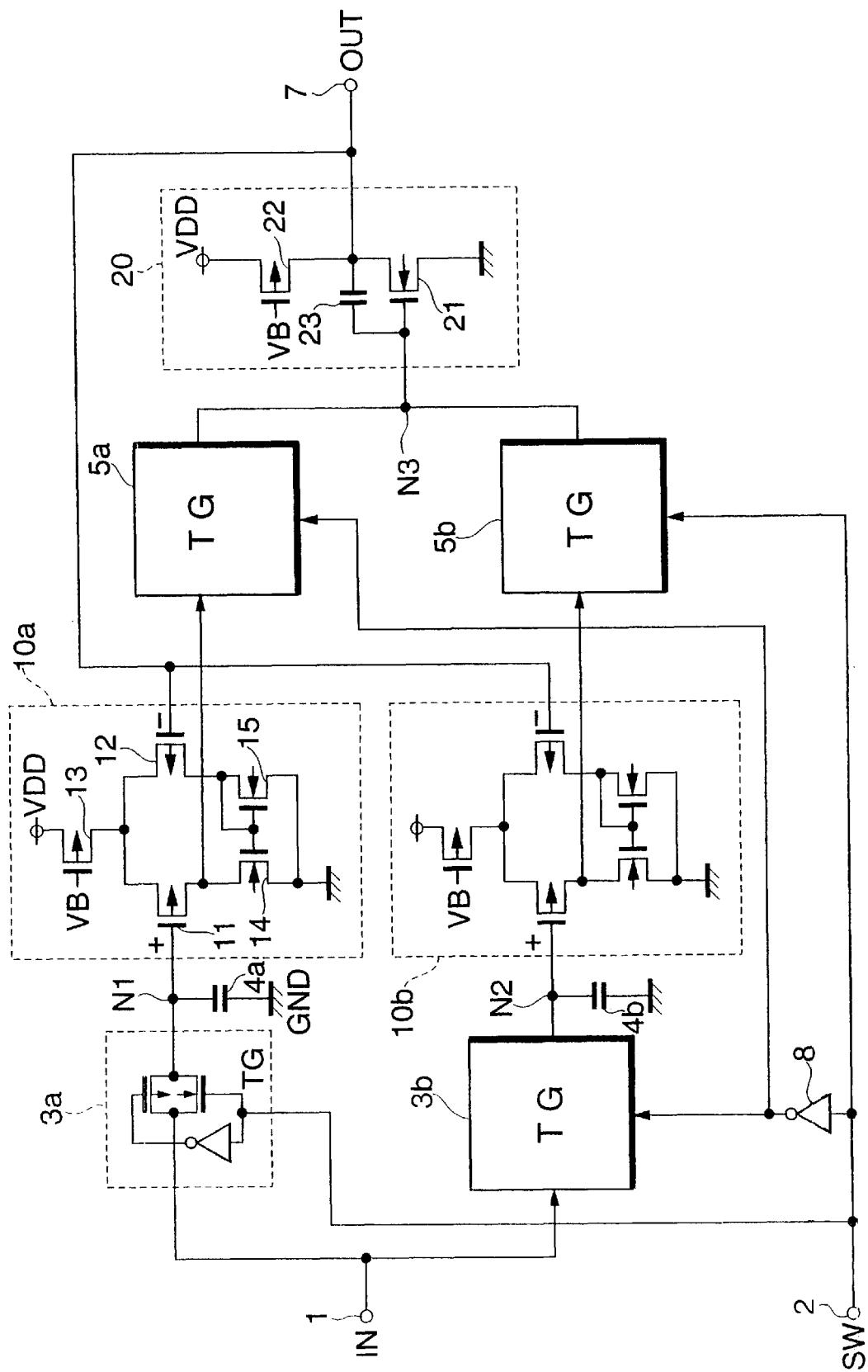
FIG. 1 is a circuit diagram of a sample and hold circuit showing the first embodiment of the invention.
Figure 2A:
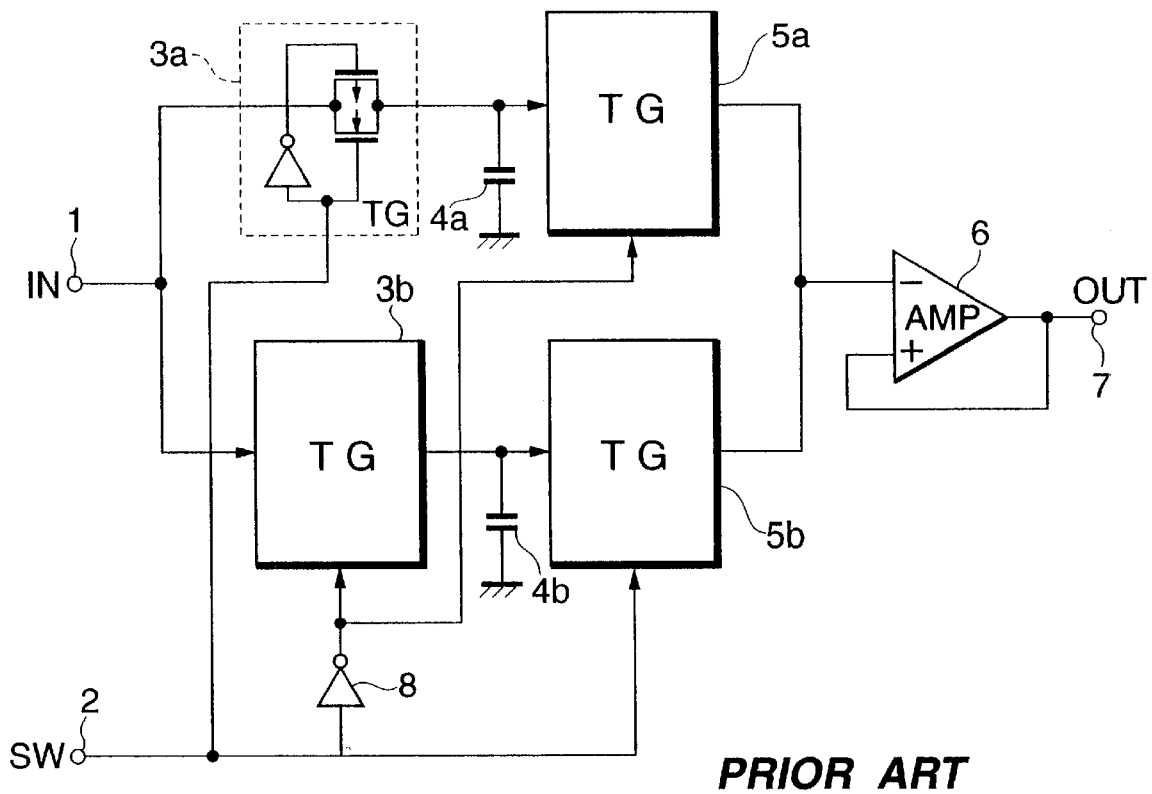
FIGS. 2(a) and 2(b) are circuit diagrams showing examples of constructions of conventional sample and hold circuits.
Figure 2B:
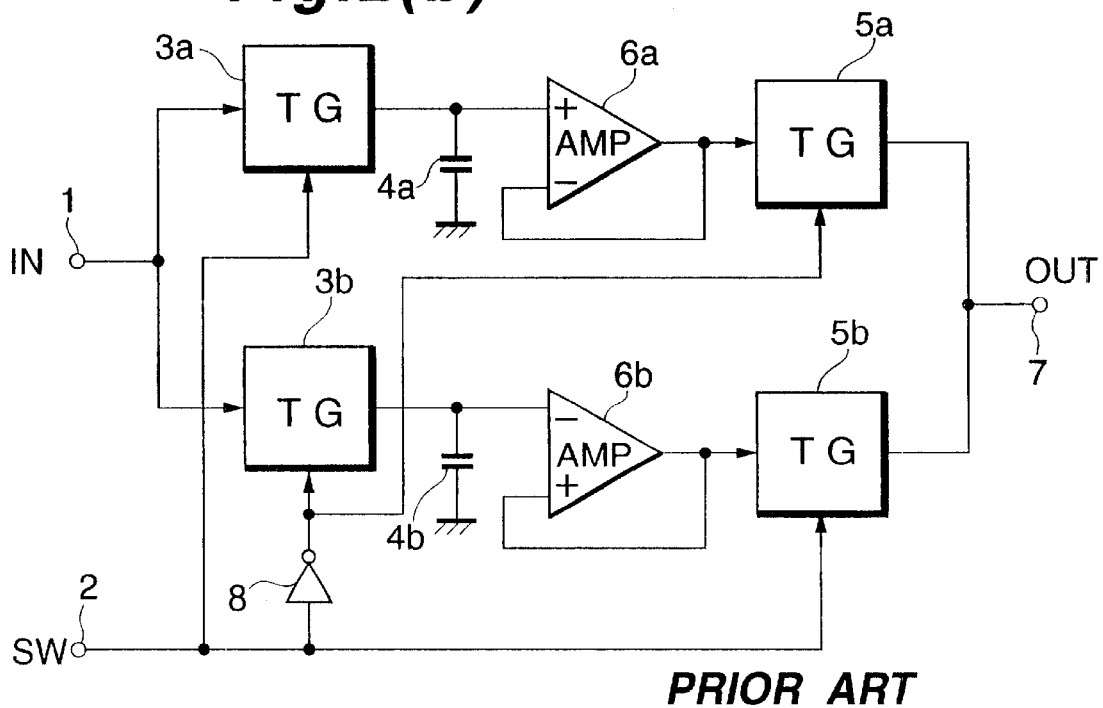

FIG. 1 is a circuit diagram of a sample and hold circuit showing the first embodiment of the invention and component elements similar to those in FIGS. 2(a) and 2(b) are designated by the same reference numerals.

The sample and hold circuit has the input terminal 1 to which the input voltage IN is applied and the control terminal 2 to which the switching signal SW is supplied. The input terminal 1 is connected to nodes N1 and N2 through the first switches (for example, TGs) 3a and 3b, respectively. The capacitors 4a and 4b to hold the input voltage IN are connected between the nodes N1 and N2 and a ground GND, respectively. Non-inverting input terminals (+) of differential input units 10a and 10b are connected to the nodes N1 and N2, respectively.

Each of the differential input units 10a and 10b has the same construction and outputs a voltage corresponding to a potential difference between the non-inverting input terminal and an inverting input terminal (−). For example, the differential input unit 10a has p-channel MOS transistors (hereinafter, also referred to as "PMOSs") 11 and 12. Gates of the PMOSs 11 and 12 constructs the non-inverting input terminal and the inverting input terminal, respectively.

Sources of the PMOSs 11 and 12 of each of the differential input units 10a and 10b are connected to a drain of a PMOS 13. A source of the PMOS 13 is connected to a power potential VDD. A bias voltage VB is applied to a gate of the PMOS 13 so that a current flowing in the PMOS 13 is set to a constant value.

Drains of the PMOSs 11 and 12 of each of the differential input units 10a and 10b are connected to the grounding potential GND through n-channel MOS transistors (hereinafter, referred to "NMOSs") 14 and 15, respectively. Gates of the NMOSs 14 and 15 are connected in common to the drain of the PMOS 12. The voltage corresponding to the potential difference between the non-inverting input terminal and the inverting input terminal is outputted from the drain of the PMOS 11.

Output terminals of the differential input units 10a and 10b, that is, the drains of the transistors 11 are connected to a node N3 in common through the second switches (for example, TGs) 5a and 5b, respectively. A gate of an NMOS 21 of an output unit 20 is connected to the node N3. A source and a drain of the NMOS 21 are connected to the grounding potential GND and output terminal 7, respectively. A PMOS 22 is connected between the output terminal 7 and power potential VDD. The bias voltage VB is applied to a gate of the PMOS 22. A capacitor 23 for correcting phase characteristics is connected between the drain and the gate of the NMOS 21.

Further, the switching signal SW of the control terminal 2 is supplied as a control signal of the TGs 3a and 5b, inverted by the inverter 8, and supplied as a control signal of the TGs 3b and 5a.

The operation will now be described.

When the switching signal SW is at the "H" level, the TGs 3a and 5b are turned on and the TGs 3b and 5a are turned off. Thus, the input voltage IN applied to the input terminal 1 is charged into the capacitor 4a through the TG 3a and supplied to the non-inverting input terminal of the differential input unit 10a. Since the output voltage OUT at the output terminal 7 is applied to the inverting input terminal of the differential input unit 10a, the voltage corresponding to a difference between the input voltage IN and the output voltage OUT is outputted from the differential input unit 10a. However, since the TG 5a is in the OFF state, it is not outputted to the node N3.

Since the TG 5b is turned on, the differential input unit 10b is connected to the output unit 20. A voltage follower circuit having a voltage amplification factor 1 is constructed by both of the units 10b and 20. Thus, the voltage charged in the capacitor 4b is generated as an output voltage OUT to the output terminal 7.

Subsequently, when the switching signal SW is set to "L", the TGs 3a and 5b are turned off and the TGs 3b and 5a are turned on. Thus, the input voltage IN applied to the input terminal 1 is charged into the capacitor 4b through the TG 3b and supplied to the non-inverting input terminal of the differential input unit 10b. At this time, since the TG 5b is in the OFF state, the input voltage IN is not outputted to the output terminal 7.

On the other hand, since the TG 5a is turned on, the differential input unit 10a is connected to the output unit 20, thereby constructing a voltage follower circuit. Thus, the voltage charged in the capacitor 4a is outputted as an output voltage OUT to the output terminal 7.

As mentioned above, according to the sample and hold circuit of the first embodiment, the input sides of the differential input units 10a and 10b are connected to the capacitors 4a and 4b for holding the input voltage IN, respectively. Therefore, the input voltage IN is simultaneously charged into the input capacitors of the capacitors 4a and 4b and differential input units 10a and 10b through the TGs 3a and 3b. Thus, the generation of the error due to an influence by the input capacitors of the differential input units 10a and 10b can be avoided.

Further, the sample and hold circuit is constructed so as to connect the output sides of the differential input units 10a and 10b to the common output unit 20 through the TGs 5a and 5b, respectively. Since the current flowing in the output unit of the AMP is usually larger than that of the differential input units by one digit or more, the current consumption can be reduced by using them by one output unit 20 in common.

(Second Embodiment)

Figure 3:
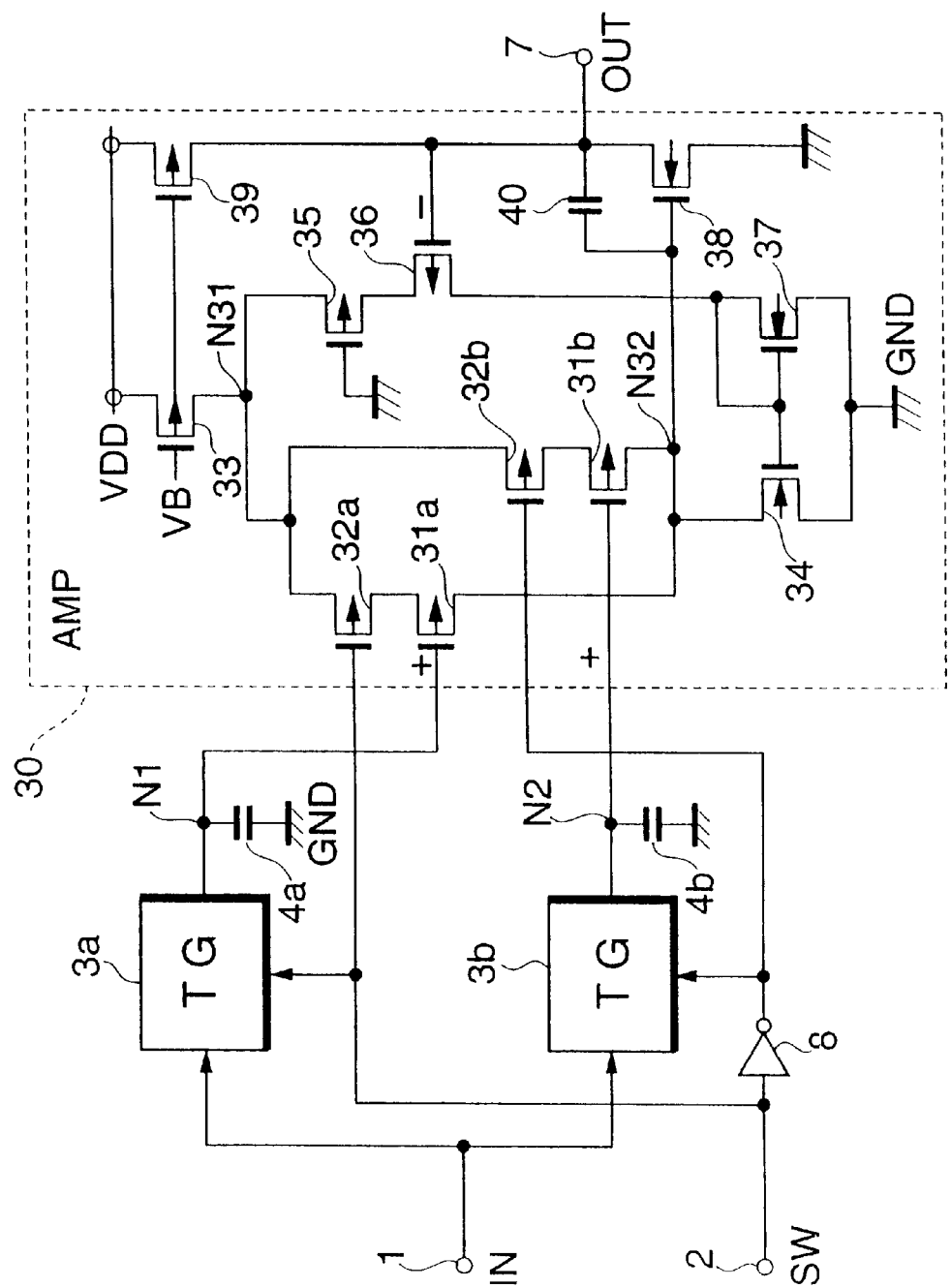
FIG. 3 is a circuit diagram of a sample and hold circuit showing the second embodiment of the invention.

FIG. 3 is a circuit diagram of a sample and hold circuit showing the second embodiment of the invention and component elements similar to those in FIG. 1 are designated by the same reference numerals.

This sample and hold circuit has the input terminal 1 to which the input voltage IN is applied and the control terminal 2 to which the switching signal SW is supplied. The input terminal 1 is connected to the nodes N1 and N2 through the switches (for example, TGs) 3a and 3b, respectively. The capacitors 4a and 4b are connected between the nodes N1 and N2 and the grounding potential GND, respectively. First and second non-inverting input units of an AMP 30 are connected to the nodes N1 and N2, respectively.

That is, gates of PMOSs 31a and 31b of the AMP 30 are connected to the nodes N1 and N2, respectively. Sources of the PMOSs 31a and 31b are connected to a node N31 through switching PMOSs 32a and 32b, respectively. The node N31 is connected to the power potential VDD through a PMOS 33 constructing a constant current circuit. Drains of the PMOSs 31a and 31b are connected to a node N32. The node N32 constructing a common output terminal of both of the differential input units is connected to the grounding potential GND through an NMOS 34.

Further, a source of a PMOS 36 is connected to the node N31 through a PMOS 35. A gate of the PMOS 35 is connected to the grounding potential GND and set so as to be always in the ON state. A gate of the PMOS 36 is connected to the output terminal 7 and a drain is connected to a drain of an NMOS 37 and gates of the NMOSs 34 and 37 in common. The PMOSs 31a, 31b, 33, and 36 and the NMOSs 34 and 37 construct both of the differential input units in the AMP 30.

The gate of the PMOS 36 constructs a common inverting input terminal of both of the differential input units. The PMOS 35 which is always held in the ON state has a resistance value which is equal to that of each of the switching MOSs 32a and 32b connected serially to the MOSs 31 a and 31b for both of the non-inverting input terminals, respectively. By inserting the PMOS 35, an increased amount of the resistance value of each of the MOSs due to the insertion of each of the switching MOSs 32a and 32b into each differential input unit can be compensated. Thus, a shunt current ratio of a current flowing in the PMOS 31a or 31b and NMOS 34 to a current flowing in the PMOS 36 and NMOS 37 constructing the inverting input terminals is held to be a predetermined value. The NMOS 34 and the NMOS 37, which are connected in a current mirror configuration, serve as a differential voltage generating unit which generates a voltage according to the difference between the current flowing in NMOS 34 and the current flowing in NMOS 37, this voltage being supplied to the gate of NMOS 38.

A gate of an NMOS 38 constructing the output unit of the AMP 30 is connected to the node N32 as a common output terminal of both of the differential input units. A source of the NMOS 38 is connected to the grounding potential GND and a drain is connected to the output terminal 7. The output terminal 7 is connected to the power potential VDD through a PMOS 39 constructing a constant current circuit.

The output unit of the AMP 30 constructs a buffer amplifier having a voltage amplification factor 1 together with each of the differential input units.

Further, the switching signal SW of the control terminal 2 is supplied as a control signal of the TG 3a and also supplied to a gate of the PMOS 32a. The switching signal SW is inverted by the inverter 8, supplied as a control signal of the TG 3b, and also supplied to a gate of the PMOS 32b.

The operation will now be described.

When the switching signal SW is at the "H" level, the TG 3a and PMOS 32b are turned on and the TG 3b and PMOS 32a are turned off. Thus, the gate of the PMOS 31b between the PMOSs 31a and 31b functions as a non-inverting input terminal of the AMP 30, and the voltage held in the capacitor 4b is outputted as an output voltage OUT to the output terminal 7. The input voltage IN applied to the input terminal 1 is supplied to the capacitor 4a and the gate of the PMOS 31a through the TG 3a. Thus, the input capacitor (gate capacitor) of the capacitor 4a and PMOS 31a is charged to the input voltage IN.

Subsequently, when the switching signal SW is set to "L", the TG 3a and PMOS 32b are turned off and the TG 3b and PMOS 32a are turned on. Thus, the gate of the PMOS 31a between the PMOSs 31a and 31b functions as a non-inverting input terminal of the AMP 30, and the voltage held in the capacitor 4a is outputted as an output voltage OUT to the output terminal 7. The input voltage IN applied to the input terminal 1 is supplied to the capacitor 4b and the gate of the PMOS 31b through the TG 3b. Thus, the input capacitor of the capacitor 4a and PMOS 31b is charged to the input voltage IN.

As mentioned above, according to the sample and hold circuit of the second embodiment, the gates of the PMOSs 31a and 31b of the AMP 30 are connected to the capacitors 4a and 4b which hold the input voltage IN, respectively.

Thus, since the input voltage IN is simultaneously held in the input capacitors of the capacitors 4a and 4b and PMOSs 31a and 31b, the generation of the error due to the influence by the input capacitance of the AMP 30 can be avoided.

Further, according to the sample and hold circuit, one AMP 30 is constructed by the pair of differential input units and the common output unit and the voltage held in each of the capacitors 4a and 4b is amplified by the voltage amplification factor 1 and outputted, so that the circuit construction can be simplified and the current consumption can be reduced.

The invention is not limited to the embodiments but many modifications and variations are possible within the spirit and scope of the invention. For example, the following modifications can be mentioned.

(a) The sample and hold circuit is not limited to the thin-film transistor driving circuit of the liquid crystal panel but can be also applied as a circuit for temporarily holding an analog voltage in response to a timing signal in an analog/digital converter or the like.

(b) Although each of the AMP comprising the differential input units 10a and 10b and output unit 20 in FIG. 1 and the AMP 30 in FIG. 3 is the voltage follower circuit having the voltage amplification factor 1, the invention can be also similarly applied to an AMP having another voltage amplification factor.

(c) In the AMP 30 in FIG. 3, the PMOS 35 for level correction can be deleted in dependence on characteristics of each transistor.

As described in detail above, according to the invention, the sample and hold circuit has the first and second differential input units which are connected to the first and second capacitors and to which the input voltages are applied. Thus, since the input capacitors of the differential input units are charged to the same electric potential as that of the capacitors for holding the input voltage, the output voltage is not influenced by the input capacitors. Since the common output unit is connected to the first and second differential input units through the second switch, the current consumption can be reduced as compared with that of an apparatus using two AMPs.

Further, according to the invention, the sample and hold circuit comprises: the first non-inverting input unit having the transistor which is controlled by the voltage of the first capacitor; the second non-inverting input unit having the transistor which is controlled by the voltage of the second capacitor; and the AMP having the inverting input unit connected to those units in parallel. Thus, since the input capacitors of the transistors of the first and second non-inverting input units are charged to the same electric potential as that of the first and second capacitors for holding the input voltage, the output voltage of the AMP is not influenced by the input capacitors. Since the transistors which are on/off controlled by the control voltage are serially connected to the first and second inverting input units, one AMP is always constructed, thereby enabling the current consumption to be further reduced.

According to the invention, the transistor which is always set to the ON state is serially connected to the transistor of the inverting input unit of the AMP. Thus, the resistance level difference caused by the transistors for on/off switching control in the non-inverting input unit is corrected and the stable differential amplifying operation can be executed.

What is claimed is:

1. A sample and hold circuit comprising:

a pair of first switches connected between an input terminal and first and second nodes, said input terminal receiving an input signal having a voltage that varies with time, said first switches being controlled by a switching signal having alternating first and second states and alternately transferring the voltage of said input signal to said first and second nodes as said states alternate;

first and second capacitors which hold the voltage of said input signal transferred to said first and second nodes, respectively;

a first differential input unit which generates a voltage corresponding to a potential difference between said first node and an output terminal, said first differential input unit including a first differential pair of transistors, a first constant current source that continuously supplies a first constant current to said first differential pair of transistors, and a first current mirror circuit which continuously sinks said first constant current after passage thereof through said first differential pair of transistors, one of the transistors of the first differential pair being connected to said first current mirror circuit at a first connection point, said voltage corresponding to said potential difference between said first node and said output terminal continuously appearing at said first connection point;

a second differential input unit which generates a voltage corresponding to a potential difference between said second node and said output terminal, said second differential input unit including a second differential pair of transistors, a second constant current source that continuously supplies a second constant current to said second differential pair of transistors, and a second current mirror circuit which continuously sinks said second constant current after passage thereof through said second differential pair of transistors, one of the transistors of said second differential pair being connected to said second current mirror circuit at a second connection point, said voltage corresponding to said potential difference between said second node and said output terminal continuously appearing at said second connection point;

a pair of second switches which are controlled by said switching signal, transfer the voltage at said second connection point in said second differential input unit to a third node while the voltage of said input signal is being transferred to said first node, and transfer the voltage at said first connection point in said first differential input unit to said third node while the voltage of said input signal is being transferred to said second node; and an output unit which outputs a voltage corresponding to the voltage at said third node to said output terminal.

2. A circuit according to claim 1, wherein said first and second differential input units have non-inverting input terminals constructed by gates of field effect transistors and inverting input terminals, said non-inverting input terminals are connected to said first and second nodes, and the voltage at the output terminal of said output unit is fed back to said inverting input terminals of said first and second differential input units, respectively.

3. A circuit according to claim 2, wherein said output unit constructs a buffer amplifier together with each of said differential input units.

4. A circuit according to claim 1, wherein each of said capacitors is a sample holding capacitor for holding a sampled image signal.

5. A sample and hold circuit comprising:

an input terminal which receives an input signal having a voltage that varies with time;

a switching signal input terminal which receives a switching signal having first and second states;

an inverter connected to said switching signal input terminal;

a pair of switches which are connected between said input terminal awl first and second nodes, one of said switches having a control terminal that is connected to said switching signal input terminal and the other of said switches having a control terminal that is connected to said inverter, so that said switches are controlled by said switching signal to alternately transfer the voltage of said input signal to said first and second nodes as said states of said switching signal alternate;

first and second capacitors that hold the voltage of said input signal transferred to said first and second nodes, respectively;

an output terminal; and a buffer amplifier connected to said first and second nodes, said buffer amplifier outputting the voltage held in said second capacitor to said output terminal while said input voltage is being transferred to said first node and outputting the voltage held in said first capacitor to said output terminal while said input voltage is being transferred to said second node, wherein said buffer amplifier comprises a first non-inverting input unit having a first transistor with a control terminal which is connected to said switching signal input terminal for on/off control of said first transistor, and a second transistor with a control terminal which receives the voltage of said first capacitor for controlling the conducting state of said second transistor, said second transistor being serially connected to said first transistor, a second non-inverting input unit which is connected to said first non-inverting input unit, said second non-inverting input unit having a third transistor with a control terminal which is connected to said inverter for on/off control of said third transistor in a complementary manner with a control terminal with said first transistor, and a fourth transistor with a control terminal which receives the voltage of said second capacitor for controlling the conducting state of said fourth transistor, said fourth transistor being serially connected with said third transistor, an inverting input unit which is connected to said first and second non-inverting input units and has a fifth transistor with a control terminal which receives the voltage at the output terminal for controlling the conducting state of said fifth transistor, a differential voltage generating unit which generates a voltage according to a difference between a current flowing in said first or second non-inverting input unit and a current flowing in said inverting input unit, and an output unit having a sixth transistor whose gate is controlled by the voltage generated from said differential voltage generating unit and which outputs a voltage corresponding to the voltage of said first or second capacitor to said output terminal.

6. A circuit according to claim 5, wherein in said buffer amplifier, a transistor which is always set to the ON state is serially connected to said fifth transistor of said inverting input unit.

* * * * *